(12) United States Patent
Eltink et al.

(10) Patent No.: US 11,756,812 B2
(45) Date of Patent: Sep. 12, 2023

(54) ADHESIVE DISPENSE UNIT

(71) Applicant: NEXPERIA B.V., Nijmegen (NL)

(72) Inventors: Erik Eltink, Nijmegen (NL); Theo ter Steeg, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 276 days.

(21) Appl. No.: 17/106,265

(22) Filed: Nov. 30, 2020

(65) Prior Publication Data
US 2021/0166955 A1    Jun. 3, 2021

(30) Foreign Application Priority Data

Dec. 3, 2019  (EP) .................................. 19213306

(51) Int. Cl.
| | |
|---|---|
| *H01L 21/67* | (2006.01) |
| *B05C 5/02* | (2006.01) |
| *H01L 21/48* | (2006.01) |
| *H01L 21/683* | (2006.01) |

(52) U.S. Cl.
CPC ............ *H01L 21/6715* (2013.01); *B05C 5/02* (2013.01); *H01L 21/67092* (2013.01); *H01L 21/4842* (2013.01); *H01L 21/6838* (2013.01)

(58) Field of Classification Search
CPC .............................. H01L 21/6715; B05C 5/02
See application file for complete search history.

(56) References Cited

U.S. PATENT DOCUMENTS

| | | | |
|---|---|---|---|
| 3,933,187 A * | 1/1976 | Marlinski | G01F 11/00 156/578 |
| 5,423,889 A | 6/1995 | Colquitt et al. | |
| 6,299,078 B1 * | 10/2001 | Fugere | B05C 17/00593 239/596 |
| 6,547,167 B1 | 4/2003 | Fugere | |
| 8,697,494 B2 * | 4/2014 | Jeon | H01L 24/97 257/738 |
| 2012/0100668 A1 * | 4/2012 | Jeon | H01L 24/97 438/107 |
| 2013/0267062 A1 | 10/2013 | Poerrer et al. | |

OTHER PUBLICATIONS

Extended European Search Report for corresponding European application EP19213306.4, 7 pages, dated Jun. 9, 2020.

* cited by examiner

*Primary Examiner* — Jeremy Carroll

(74) *Attorney, Agent, or Firm* — Ruggiero, McAllister & McMahon LLC

(57) ABSTRACT

This disclosure relates to an adhesive dispense unit for a semiconductor die bonding apparatus. The adhesive dispense unit includes an adhesive dispense nozzle and a pin member; the pin member comprising a down stand portion and a sheath portion, and the down stand is reciprocateable within the sheath portion.

17 Claims, 4 Drawing Sheets

PRIOR ART

PRIOR ART

ADHESIVE DISPENSE UNIT

CROSS REFERENCE TO RELATED APPLICATION

This application claims the benefit under 35 U.S.C. § 119(a) of European Application No. 19213306.4 filed Dec. 3, 2019 the contents of which are incorporated by reference herein in their entirety.

BACKGROUND OF THE DISCLOSURE

1. Field of the Disclosure

The present disclosure relates to an adhesive dispense unit for a semiconductor die bonding apparatus. In particular this disclosure relates an adhesive dispense unit for dispensing an adhesive die attachment material.

2. Description of the Related Art

In semiconductor devices, leadframes are metal support structures onto which semiconductor dies are mounted. Leadframes allow for the connection of the terminals of the semiconductor die to the external leads that electrical carry signals from the die. Leadframes typically manufactured from sheet copper or sheet copper-alloy and typically have a thickness in the range of 100 μm to 300 μm. Semiconductor dies are typically attached to the leadframe by conductive adhesive materials.

Due to the ductile nature of the leadframe metals, the leadframes are often warped or bent prior to use and this can cause the problem that the leadframes are hard to clamp on a work holder such as a shuttle or dispense plate by vacuum due to vacuum leakage. A typical representation of the bent or warped leadframe 102 mounted on a work holder 104 is shown in FIG. 1. Dependent on the thickness of the leadframe material and other manufacturing factors such as stamping, etching and/or bending the amount that the leadframe is warped, will vary from leadframe to leadframe.

This difficulty in clamping, and variation in the amount that the leadframe is warped can cause problems in positioning the leadframe on the work holder 104 and can thus prevent accurate dispensing of the conductive adhesive material 108 on the leadframe 102. This positional inaccuracy is shown in FIG. 1 by considering that the spacing X between an adhesive dispense head 106 and the leadframe 102 may vary and be undefined depending on the amount that the leadframe is warped.

The adhesive material 108 is formed as a droplet at the opening of the adhesive dispense head 106. The adhesive droplet at the opening of the adhesive dispense head 106 may be formed by capilliary action or by a pump such as an Archimedes screw pump whereby a single screw rotates in a cylindrical cavity, thus moving the adhesive material 108 along the axis of the screw spindle to the opening of the adhesive dispense head 106.

The amount of adhesive dispensed may vary with increasing or decreasing spacing X. A smaller spacing X will squeeze the droplet between needle tip and leadframe, making the size of drop larger. A larger drop my also cause contamination of the side walls of the dispense head.

One arrangement which attempts to minimise the positional inaccuracy is shown in FIGS. 2a to 2d where the adhesive dispense head 106 includes a fixed downstand member 110. In FIG. 2a, the downstand 110 affixed to the adhesive dispense head 106 having a drop of adhesive material formed at the opening approaches the leadframe 102. In FIG. 2b the downstand 110 contacts the leadframe 102 and depending on the amount that the leadframe is warped the droplet of the adhesive material 108 may also contact the leadframe at this time. In FIG. 2c the movement of the downstand 110 ultimately forces the leadframe 102 into contact with the work holder 104, such that the warp on the leadframe is flattened by the downstand 110. Ideally at this stage, the drop of adhesive material 108 would come into contact with the leadframe for the first time, rather than earlier but as discussed above this is dependent on the amount that the leadframe 102 is warped. In FIG. 2d, the downstand is raised from the leadframe 102. Initially, the will no longer be flattened to the workholder 104, and the leadframe will warp upwards. As the adhesive dispense head 106 is moved away from the leadframe 102, the adhesive material will remain on the leadframe 102.

The problem with arrangements of the type described above is that the time of contact between drop of adhesive material 108 and leadframe 102 is dependent on how much the leadframe 102 is warped and as explained this may vary from leadframe to leadframe. For accurate and repeatable drop volume control the time that the drop of adhesive material 108 is in contact with the leadframe 102 should be known.

Therefore die attach processes are affected by the above described position inaccuracies which are as a result of the uncontrolled dispensing of the adhesive die attach material. This position inaccuracy can limit the smallest size of package which affects the amount of adhesive dispensed on the leadframe and to overcome this positional inaccuracy extra space is needed to prevent adhesive from contaminating areas nearby. On top of this, the position inaccuracy may slow down the bonding processes and die attach in die bonding machines, which typically operate with a throughput of 10,000 to 100,000 units per hour (uph) where any slow down could result in a throughput reduction of 25-75%.

Alternative solutions exist whereby a window clamp is arranged around a series of die pads on the lead frame, there by the window clamp hold the leadframe around the circumference of the clamp. Whilst the clamp is fixed an adhesive dispense head is moved over the window and the adhesive is dispensed as appropriate. The clamp is then released and moved to the next series of die pads. However, this arrangement limits the speed at which the adhesive dispense head can operate due to the requirement to move the dispense head over the window.

SUMMARY

Various example embodiments are directed to issues such as those addressed above and/or others which may become apparent from the following disclosure.

According to an embodiment there is provided an adhesive dispense unit for a semiconductor die bonding apparatus, the adhesive dispense unit comprising: an adhesive dispense nozzle; and a pin member; the pin member comprising a down stand portion and a sheath portion, and wherein the down stand is reciprocateable within the sheath portion.

The down stand portion may be biased within the sheath portion by a resilient bias member.

The resilient bias member may be a spring member.

The pin member may be mountably arranged adjacent to the adhesive dispense nozzle.

The maximum extent of the pin member with respect to the adhesive dispense nozzle may be in the range of 0.3 mm to 10 mm.

The adhesive dispense unit according to embodiments further comprising a housing, wherein the adhesive dispense nozzle and the pin member are mounted to the housing.

The housing may comprise a pump mechanism configured and arranged to pump adhesive material to the adhesive dispense nozzle. The pump mechanism may be an Archimedes screw.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

FIG. 3b illustrates a cross-sectional view of the adhesive dispense unit according to FIG. 3a.

DETAILED DESCRIPTION

Figure 1:
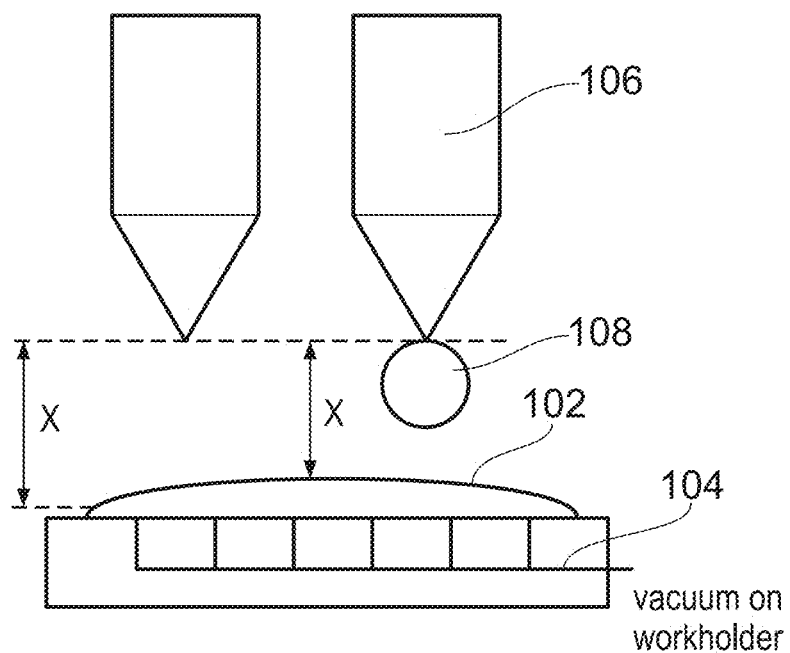
FIG. 1 shows a known adhesive dispense head and leadframe mounted on a work holder prior to dispensing of conductive adhesive material.
Figure 2A:
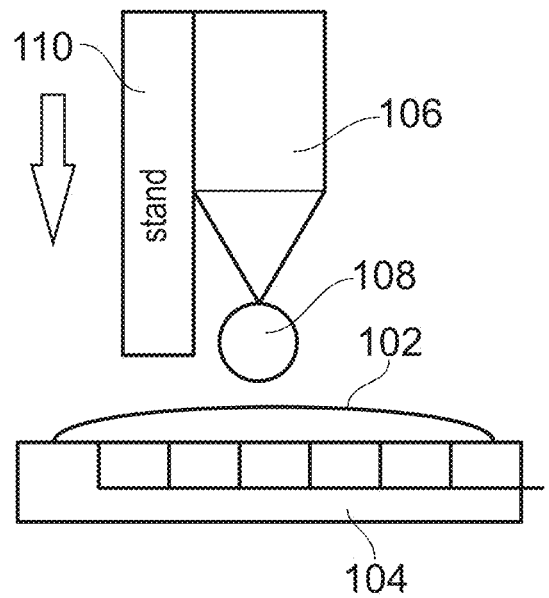
FIG. 2a shows a known adhesive dispense head with downstand member and leadframe mounted on a work holder prior to dispensing of conductive adhesive material.
Figure 2B:
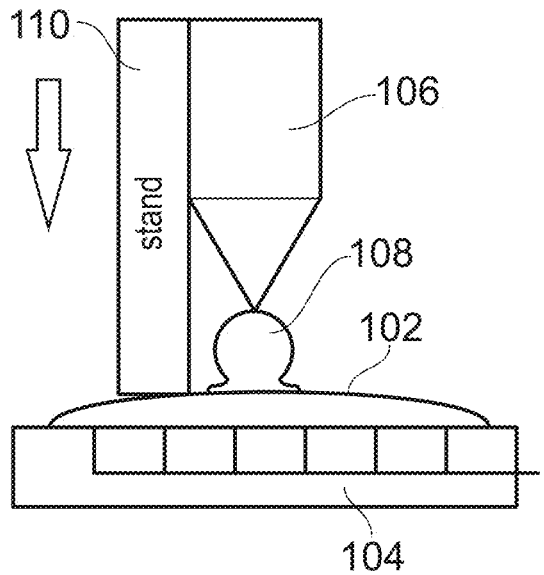
FIG. 2b shows a known adhesive dispense head with downstand member and leadframe mounted on a work holder during dispensing of conductive adhesive material.
Figure 2C:
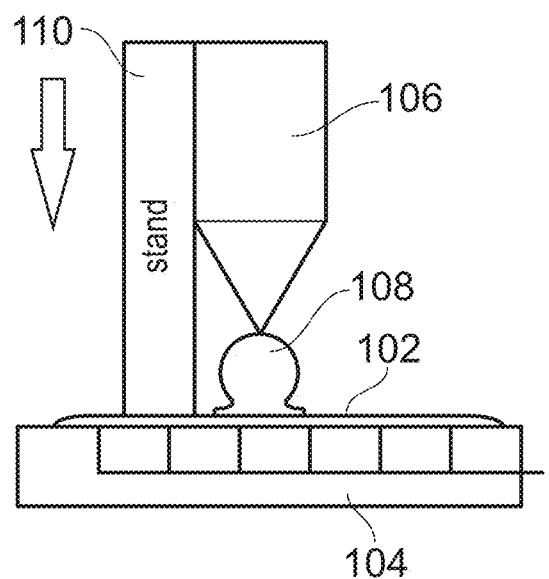
FIG. 2c shows a known adhesive dispense head with downstand member and leadframe mounted on a work holder during dispensing of conductive adhesive material.
Figure 2D:
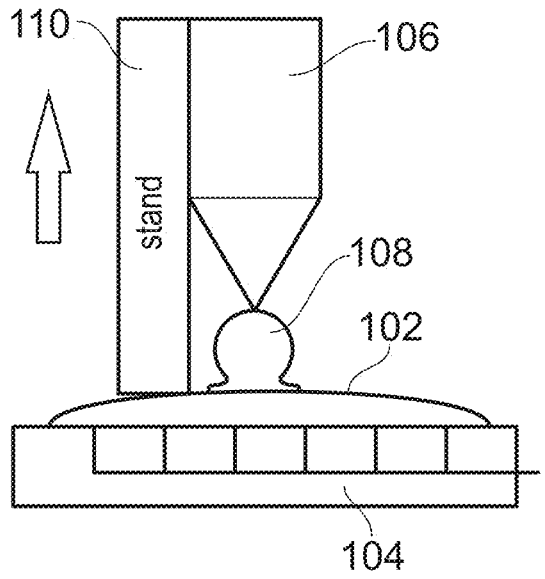
FIG. 2d shows a known adhesive dispense head with downstand member and leadframe mounted on a work holder after dispensing of conductive adhesive material.
Figure 3B:
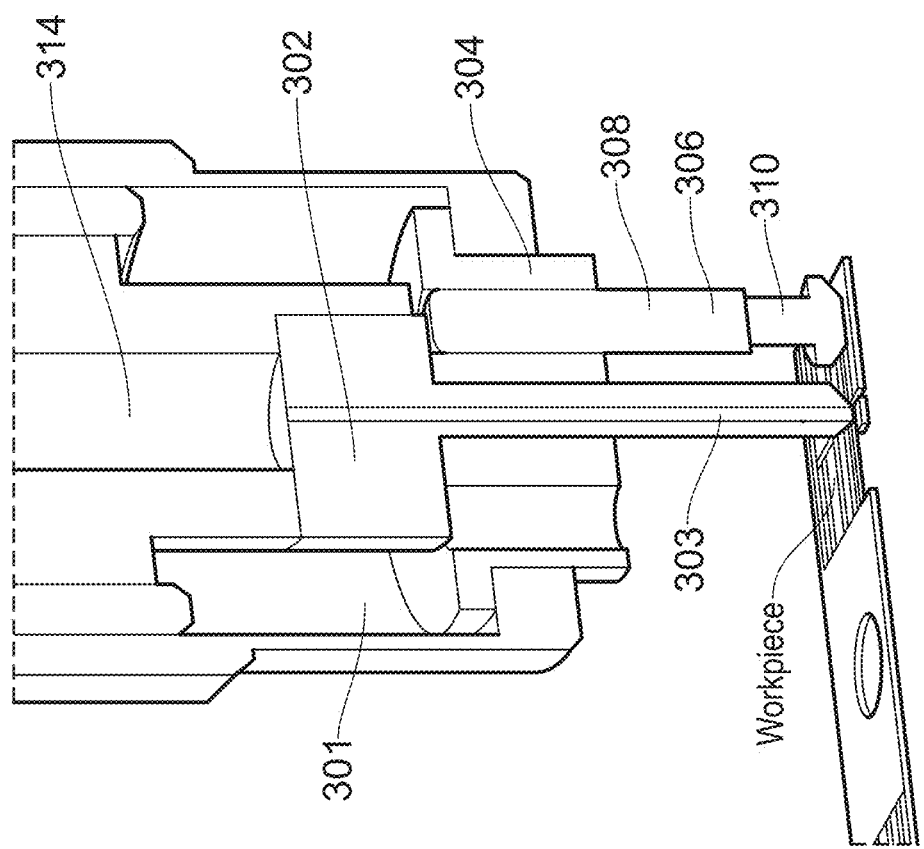
Figure 3A:
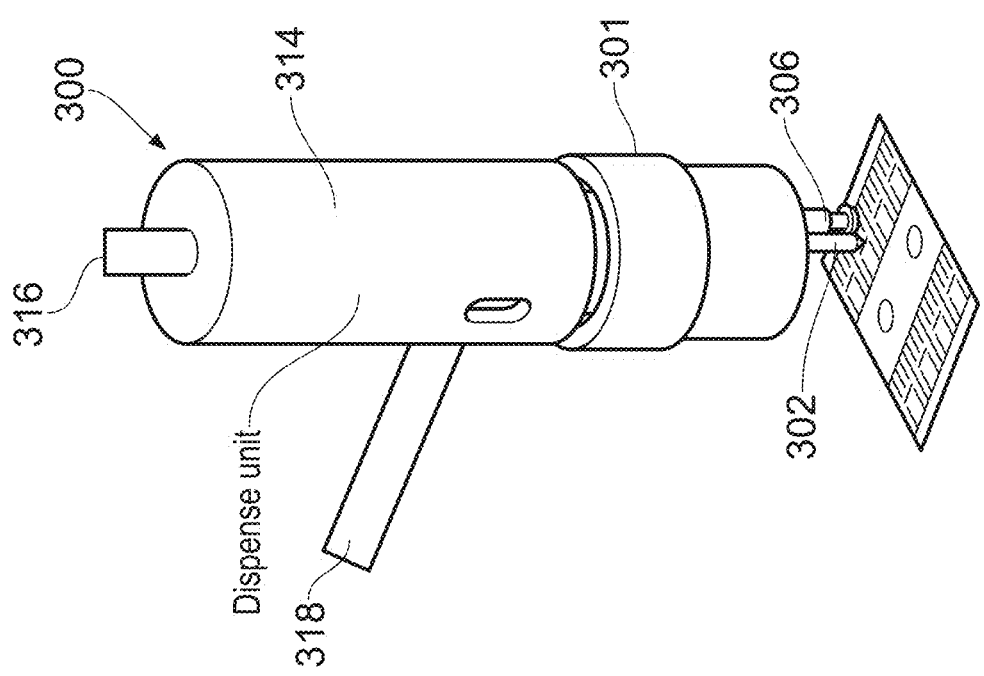
FIG. 3a illustrates an adhesive dispense unit according to embodiments.

FIG. 3a illustrates an adhesive dispense unit 300 for a semiconductor die bonding apparatus according to embodiments. The adhesive dispense unit 300 comprises a housing 301, an adhesive dispense nozzle such as a dispense needle 302 and a pin member 306 mounted to the housing 301. Typically, the dispense needle 302, pin member 306 and housing 301 are formed of metals such as steel, copper, aluminium or metal alloys.

The housing 301 comprises a first input 318 to input the adhesive into the housing. The housing 301 contains pump mechanism such as an Archimedes screw (not illustrated) which receives adhesive under pressure via the first input 318, which supplies the adhesive under pressure. The skilled person will appreciate that any appropriate pump mechanism may be used. A spindle 316 of the pump mechanism may arranged at a first end of a chamber 314 and the dispense needle 302 is arranged at a second end of the chamber 314 distal the first end.

FIG. 3b illustrates an internal cross-sectional view of the adhesive dispense unit for a semiconductor die bonding apparatus and illustrates the dispense needle 302 and a pin member 306 according to FIG. 3a in more detail.

The dispense needle 302, comprises a channel 303 therethrough to allow liquid die attach adhesive to be dispensed from an reservoir (not illustrated) through the first input 318 via the pump mechanism in chamber 314 and on to the channel 303 of dispense needle 302. The liquid adhesive is pumped under pressure from the reservoir and dispensed by the dispense needle 302 under pressure of the pump mechanism whereby it is dispensed through the channel 303 of the dispense needle 302 to a target position, such as the surface of a substrate, for example a leadframe. The dispense needle is 302 is arranged to be adjacent and side by side to the pin member 306 at the second end of the chamber. Ideally the dispense needle is 302 should be as close as possible to the pin member with out touching the pin member 306.

The pin member comprises 306 a down stand 310 and a sheath member 308 and the down stand member 310 is reciprocateably moveable between a first position and a second position within the sheath member 308. Typically, the difference between maximum and minimum extent of the pin min member will be 2 mm, however, the skilled person will appreciate this can be any appropriate value dependent on the predicted deformation of the leadframe.

The sheath member 308 may be a distinct member connected to the housing 301 of the dispense unit 300, or alternatively the sheath member 308 may be a simple channel formed in the housing 301 to allow the down stand member 310 to reciprocate therein. The down stand member 310 may be resiliently biased in the sheath member 308 such that it extends outwardly from the sheath member 308 and can reciprocate within the sheath member 308 by the application of an force greater than the resilient bias force. The resilient bias may be achieved by way of a bias spring such as a coil spring or a cantilever spring. However, whilst the present embodiment contemplates coil springs or cantilever springs the skilled person will appreciate that any appropriate resilient biasing means may be utilised. Typically, the down stand member and pin member are formed of metals such as stainless steel or goldplated brass.

The operation of the dispensing unit 300 according to embodiments will now be described with reference to FIGS. 4a to 4c. For clarity and ease of understanding, the dispensing unit 300 and workholder are shown in simplified block form and like reference numerals in FIGS. 4a to 4c refer to like features of FIGS. 3a and 3b.

Figure 4C:
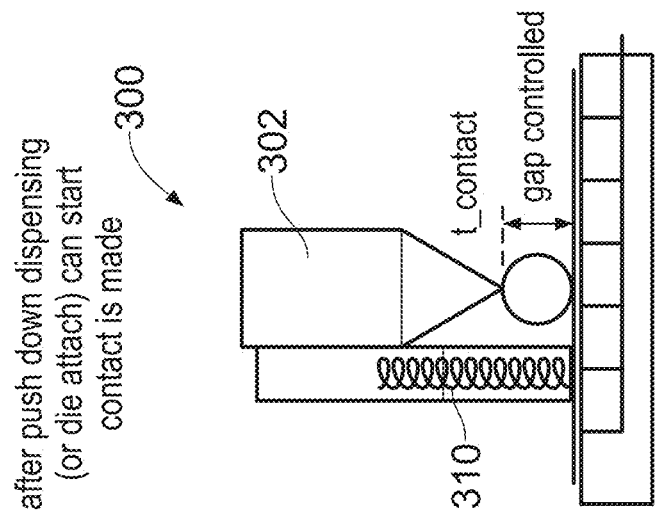
FIG. 4c illustrates an adhesive dispense unit according to embodiments and leadframe mounted on a work holder during dispensing of conductive adhesive material.
Figure 4B:
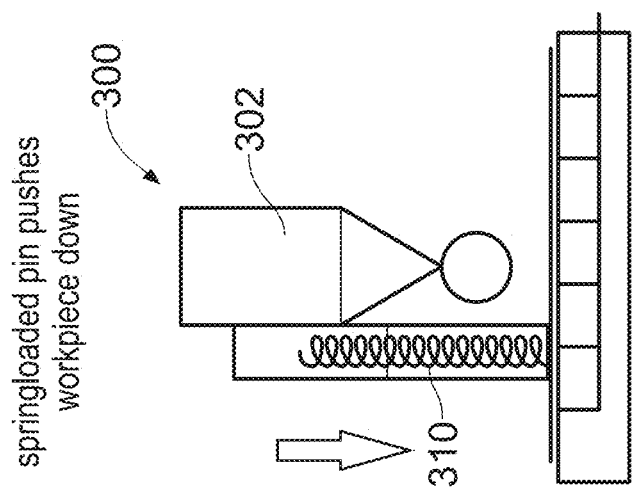
FIG. 4b illustrates an adhesive dispense unit according to embodiments and leadframe mounted on a work holder prior to dispensing of conductive adhesive material.
Figure 4A:
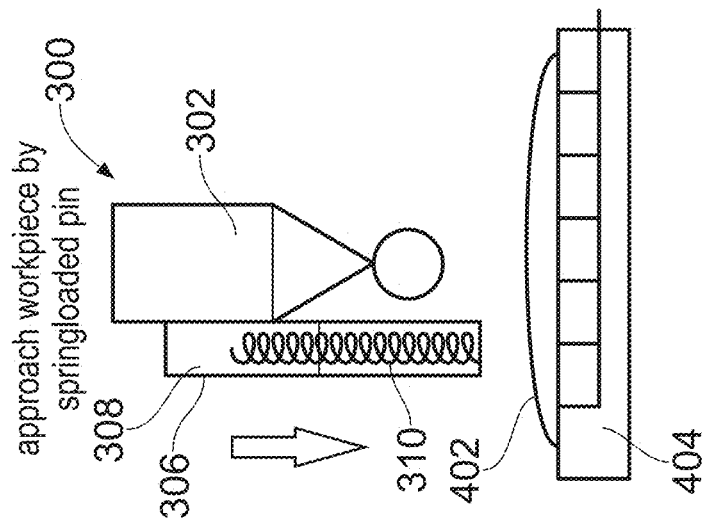
FIG. 4a illustrates an adhesive dispense unit according to embodiments and leadframe mounted on a work holder prior to dispensing of conductive adhesive material.

As illustrated in FIG. 4a a work holder 404 holds a lead frame 402 in place. The work holder 404 may be a vacuum type chuck work holder which comprises a flat upper surface against which the leadframe is firmly held by application of vacuum pressure thereon. Vacuum type chuck work holders are typically used for non-ferrous material leadframes. Alternatively, where the lead frame is a ferrous material, a magnetic type chuck may be used. Regardless of the type of work holder, the lead frame 402 may be warped or twisted as is sits on the work holder, as shown for example by the upward curve of the lead frame 402 in FIG. 4a.

A droplet of liquid adhesive is formed at the opening of the dispense needle 302 by the pump mechanism in chamber 314. As the dispense needle 302 of the dispensing unit 300 approaches the leadframe, as fixed on the work holder 404, the down stand 310 of the pin member 306 contacts the leadframe. When the down force of the pin member 306, as resiliently biased in the sheath member 308, is greater than the up force of the warped leadframe, the down stand 310 will force the leadframe towards the top surface of the work holder, such that the lead frame will be forced substantially flat on the top surface of the work holder, as illustrated in FIG. 4b. Due to the resiliently biased down stand 310 which can reciprocate within the sheath member 308, the dispense needle 302 may continue to move towards the leadframe such that the down stand 310 can move within the sheath member 308 until the droplet of liquid die attach adhesive contacts the leadframe as illustrated in FIG. 4c. The contact of the leadframe with the liquid die attach adhesive causes the die attach adhesive to be dispensed onto the leadframe by capillary action.

As illustrated in FIG. 4c the gap between the opening of the dispense needle 302 is controlled by the determining the height of the work holder prior to dispensing and by the defined position of the leadframe on the work holder.

In this way the down stand 310 of the dispensing unit 300 ensures that the lead frame is substantially flat, in that any warping or deformation which causes the leadframe to sit above the work holder is removed by forcing the lead frame to conform to the surface of the work holder. Yet further, the above arrangement ensures that any amount of warping or deformation in the lead frame up to 10 mm may be removed.

Moreover the reciprocating nature of the down stand 310 allows the distance between the dispense needle 302 and the leadframe to be controlled such that the shape of the die attach adhesive is controlled. Therefore, for a constant distance of movement of the dispense needle 302, the time that the droplet of liquid die attach adhesive is attached to both the needle 302 and the leadframe is reduced, thus improving the repetitive amount of adhesive dispense as mentioned above.

Based on the above disclosure, the skilled person will therefore see that the dispensing unit 300 allows for improved dispensing of die adhesive. In addition because the pin member 306 acts in-line, that is acts as the dispense needle 302 dispenses the die attach adhesive the dispensing unit according to embodiments will not slow down the die adhesive dispensing process when compared to traditional dispensing units because of improved volume control the yield will go up, packages can be smaller, pitches becomes smaller and therefore speed is gained. Improved volume control of the adhesive dispense will also result in less time for dispense needle cleaning enabling more uptime for the adhesive dispense unit.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. An adhesive dispense unit for a semiconductor die bonding apparatus,
the adhesive dispense unit comprising:
an adhesive dispense nozzle; and
a pin member, the pin member comprising a down stand portion and a sheath portion, and
wherein the down stand portion is reciprocatable within the sheath portion.

2. The adhesive dispense unit of claim 1, wherein the down stand portion is biased within the sheath portion by a resilient bias member.

3. The adhesive dispense unit of claim 2, wherein the resilient bias member is a spring member.

4. The adhesive dispense unit of claim 1, wherein the pin member is mountably arranged adjacent to the adhesive dispense nozzle.

5. The adhesive dispense unit of claim 2, wherein the pin member is mountably arranged adjacent to the adhesive dispense nozzle.

6. The adhesive dispense unit of claim 3, wherein the pin member is mountably arranged adjacent to the adhesive dispense nozzle.

7. The adhesive dispense unit of claim 1, wherein the pin member has a maximum extent with respect to the adhesive dispense nozzle that is in a range of 0.3 mm to 10 mm.

8. The adhesive dispense unit of claim 2, wherein the pin member has a maximum extent with respect to the adhesive dispense nozzle that is in a range of 0.3 mm to 10 mm.

9. The adhesive dispense unit of claim 3, wherein the pin member has a maximum extent with respect to the adhesive dispense nozzle that is in a range of 0.3 mm to 10 mm.

10. The adhesive dispense unit of claim 4, wherein the pin member has a maximum extent with respect to the adhesive dispense nozzle that is in a range of 0.3 mm to 10 mm.

11. The adhesive dispense unit of claim 1, further comprising a housing, wherein the adhesive dispense nozzle and the pin member are mounted to the housing.

12. The adhesive dispense unit of claim 2, further comprising a housing, wherein the adhesive dispense nozzle and the pin member are mounted to the housing.

13. The adhesive dispense unit of claim 3, further comprising a housing, wherein the adhesive dispense nozzle and the pin member are mounted to the housing.

14. The adhesive dispense unit of claim 4, further comprising a housing, wherein the adhesive dispense nozzle and the pin member are mounted to the housing.

15. The adhesive dispense unit of claim 7, further comprising a housing, wherein the adhesive dispense nozzle and the pin member are mounted to the housing.

16. The adhesive dispense unit of claim 11, wherein the housing comprises a pump mechanism configured and arranged to pump adhesive material to the adhesive dispense nozzle.

17. The adhesive dispense unit of claim 16, wherein the pump mechanism is an Archimedes screw.

* * * * *